(12) United States Patent
Doyle et al.

(10) Patent No.: US 11,948,807 B2
(45) Date of Patent: Apr. 2, 2024

(54) FEATURE SELECTION THROUGH SOLDER-BALL POPULATION

(71) Applicant: International Business Machines Corporation, Armonk, NY (US)

(72) Inventors: Matthew Doyle, Chatfield, MN (US); Thomas W. Liang, Rochester, MN (US); Layne A. Berge, Rochester, MN (US); John R. Dangler, Rochester, MN (US); Jason J. Bjorgaard, Rochester, MN (US); Kyle Schoneck, Rochester, MN (US); Matthew A. Walther, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 17/216,932

(22) Filed: Mar. 30, 2021

(65) Prior Publication Data
US 2022/0319867 A1 Oct. 6, 2022

(51) Int. Cl.
*H01L 21/48* (2006.01)
*H05K 3/40* (2006.01)

(52) U.S. Cl.
CPC ......... *H01L 21/485* (2013.01); *H05K 3/4007* (2013.01); *H05K 2203/043* (2013.01)

(58) Field of Classification Search
CPC ........... H05K 1/0292; H05K 2203/176; H05K 2201/0305; H05K 2203/046; H05K 13/0409; H05K 2203/0113; H01L 21/485; H01L 23/5382; H01L 24/799; H01L 2224/7999; G06F 11/2041; G06F 11/202; B23K 1/018; B23K 1/029
See application file for complete search history.

(56) References Cited

U.S. PATENT DOCUMENTS

| | | | |
|---|---|---|---|
| 3,268,653 A | 8/1966 | Mcnutt | |
| 4,779,565 A | 10/1988 | Young et al. | |
| 5,275,330 A | 1/1994 | Isaacs et al. | |
| 5,478,009 A * | 12/1995 | Interrante | B23K 1/018 |
| | | | 228/264 |

(Continued)

FOREIGN PATENT DOCUMENTS

| | | |
|---|---|---|
| JP | 57190767 A | 11/1982 |
| JP | H01309396 A | 12/1989 |

(Continued)

OTHER PUBLICATIONS

"Overview Vacuum Hole Filling," Adeon, Printed Mar. 30, 2021, 6 pages, https://www.adeon.nl/products/hole-filling-systems/vacuum-hole-filling.

(Continued)

*Primary Examiner* — Alia Sabur
(74) *Attorney, Agent, or Firm* — Peter J. Edwards (57) ABSTRACT

A set of features for a product is identified. It is determined that preventing an electrical connection at a ball-grid-array location on a ball-grid-array assembly of the product would result in the set of features. The ball-grid-array location is established as a target BGA location based on that determination. Suction is applied to a via at the target BGA location during reflow of the ball-grid-array assembly. With that application of suction, a solder ball at the target BGA location is drawn into the via.

16 Claims, 7 Drawing Sheets

(56) References Cited

U.S. PATENT DOCUMENTS

| | | | |
|---|---|---|---|
| 5,489,750 A | 2/1996 | Sakemi et al. | |
| 5,641,946 A | 6/1997 | Shim | |
| 5,753,070 A | 5/1998 | Dandia | |
| 5,802,712 A | 9/1998 | Sakai et al. | |
| 5,907,903 A | 6/1999 | Ameen et al. | |
| 6,037,665 A | 3/2000 | Miyazaki | |
| 6,088,914 A | 7/2000 | Variot et al. | |
| 6,276,055 B1 | 8/2001 | Bryan et al. | |
| 6,443,351 B1 | 9/2002 | Huang et al. | |
| 6,444,497 B2 | 9/2002 | Wensel et al. | |
| 6,461,136 B1 | 10/2002 | Gruber et al. | |
| 6,750,549 B1 | 6/2004 | Chandran et al. | |
| 7,546,941 B2 | 6/2009 | No et al. | |
| 8,604,614 B2 | 12/2013 | Kwon et al. | |
| 8,911,242 B2 | 12/2014 | Jeon et al. | |
| 9,385,098 B2 | 7/2016 | Zhang et al. | |
| 9,842,818 B2 | 12/2017 | Li et al. | |
| 9,960,105 B2 | 5/2018 | Jiang et al. | |
| 11,432,372 B2 | 8/2022 | Cheng et al. | |
| 2003/0096448 A1* | 5/2003 | Kever | H01L 21/485 438/106 |
| 2005/0087588 A1* | 4/2005 | Weigler | H05K 3/3457 228/264 |
| 2007/0281473 A1 | 12/2007 | Clark et al. | |
| 2008/0057691 A1 | 3/2008 | Dando et al. | |
| 2008/0274569 A1 | 11/2008 | Tsao et al. | |
| 2009/0294974 A1 | 12/2009 | Leung et al. | |
| 2011/0079632 A1 | 4/2011 | Chey et al. | |
| 2018/0005972 A1* | 1/2018 | Hossain | H01L 23/50 |
| 2019/0254174 A1 | 8/2019 | Tanaka et al. | |
| 2023/0026967 A1* | 1/2023 | Williamson | H01L 21/485 |

FOREIGN PATENT DOCUMENTS

| | | |
|---|---|---|
| JP | 10135276 A | 5/1998 |
| KR | 20030001029 A | 1/2003 |

OTHER PUBLICATIONS

"Vertical vacuum plugging machine," Mass, PCB in Progress, Printed Mar. 26, 2021, 2 pages https://www.mass-pcb.de/viaholefilling.html.

Yeary et al., "Variables Affecting Bare PCB Warpage During Reflow; a Study on Support Methods and Temperature Uniformity," PCB West 2017 Conference & Exhibition, 2017, 46 pages, http://akrometrix.com/wp-content/uploads/2016/02/Variables-Affecting-Bare-PCB-Warpage-During-Reflow.pdf.

Lee, "Root Cause Failure Analysis of Printed Circuit Board Assemblies," Wisconsin Chapter SMTA, Mar. 8, 2011, 62 pages.

"Got problems? Let us find the solution!," Creative Electron, the X-Ray People, Printed Mar. 26, 2021, 5 pages.

Doyle et al., "Vacuum-Assisted BGA Joint Formation," U.S. Appl. No. 17/216,863, filed Mar. 30, 2021.

List of IBM Patents or Patent Applications Treated as Related, Dated Mar. 29, 2021, 2 pages.

* cited by examiner

FEATURE SELECTION THROUGH SOLDER-BALL POPULATION

BACKGROUND

The present disclosure relates to selecting feature sets in electronic products, and more specifically, to configuring feature sets by customizing ball-grid-array formation.

Manufacturers of electronic products sometimes manufacture and sell multiple products that, though physically very similar, have different features. Manufacturers may vary the features of their products to meet the demands of multiple market segments, to meet security requirements of certain clients, and to allow products that would be defective at high-performance tiers to be sold at low-performance tiers.

SUMMARY

Some embodiments of the present disclosure can be illustrated as a method. The method includes identifying a set of features for a product. The method also includes determining that preventing an electrical connection at a ball-grid-array location on a ball-grid-array assembly of the product would result in the set of features. The method also includes establishing the ball-grid-array location as a target BGA location based on the determining. The method also includes applying suction to a via at the target BGA location during reflow of the ball-grid-array assembly. The method also includes drawing a solder ball at the target BGA location into the via with the application of suction.

Some embodiments of the present disclosure can also be illustrated as a system. The system includes a processor and a memory. The memory is in communication with the processor. The memory contains program instructions that, when executed by the processor, are configured to cause the processor to perform the above method.

Some embodiments of the present disclosure can also be illustrated as a second system. The second system includes an apparatus for performing reflow on a ball-grid-array assembly of a product. The second system also includes a vacuum assembly connected to the apparatus. The vacuum assembly comprises a vacuum head that is configured to be positioned below a via at a ball-grid array location in the ball-grid-array assembly. Applying sufficient suction to the via with the vacuum head during reflow prevents a connection at the ball-grid-array location. Preventing the connection at the ball-grid-array location results in a first feature set of the product.

DETAILED DESCRIPTION

The present disclosure relates to selecting feature sets in electronic products, and more specifically, to configuring feature sets by customizing ball-grid-array formation.

Manufacturers of electronic products sometimes sell several closely related products with slightly differing features. For example, some models of a personal computer (such as a tablet or laptop) may be available with only wired communication capabilities (e.g., Ethernet), whereas some models may be sold with limited wireless communication capabilities (e.g., local area network), and some models may be sold with more extensive wireless communication capabilities (e.g., local area network and cellular).

Producing similar products with different features can allow a manufacturer to efficiently serve a set of consumers with the set of features they most want, while not providing features that consumers in that set do not desire. This may allow the manufacturer to price the product according to only those provided features, which can make the product more attractive to that set of consumers. However, another set of consumers may want a far more extensive set of features. Providing a similar product for that set of consumers with a more extensive set of features may enable the manufacture to provide a product for that set of consumers at a higher price, capitalizing more on that set of consumer's increased demands. Thus, by adjusting the set of features that are included in related products, a manufacture may be able to profitably serve several brackets of a market.

Similarly, a manufacturer may produce similar products with different features to meet restrictions of individual consumers or industry requirements. For example, some consumers may have strict security preferences, and may require that all personal computers purchased from the manufacturer have no USB ports or only non-functional USB ports. As another example, consumers in some industries may be required to meet certain standards, such as storage-speed standards. Devices sold to these consumers may sacrifice processor resources that could be devoted to other purposes in order to increase the communication lanes between the system storage and the processor. However, by adjusting the features on devices sold the mainstream market, a manufacturer may be able to meet the discerning needs of these consumers without creating a new product line. Thus, by adjusting the features that are included in related products, a manufacture may be able to meet the individual requirements of specific consumers and industries in an efficient way.

In theory, a manufacturer could establish a different physical product for each unique set of features sold to consumers. Recalling the laptop/tablet example above, a manufacturer could manufacture a first product that does not contain any wireless modules (e.g., a soldered wireless card or a soldered port that can accept a wireless card) or antennas. The manufacturer could also manufacture a second product that contains antennas and wireless modules necessary for local-area-network communication, but has no other physical equipment for more extensive wireless communication capabilities. The manufacturer could also manufacture a third product that contains antennas and wireless modules not only for local-area-network communication, but also for cellular communication.

Similarly, processor manufacturers could create a first processor chip with four cores to be sold to standard users, and a completely different processor chip with eight cores to be sold to higher-end consumers. Similarly, the first processor chip may run at a lower clock speed and have fewer PCIe lanes available to it than the different processor chip. In theory, these processors could be made using completely independent manufacturing processes and produce completely independent processor dies.

Similarly, a manufacturer could produce a first personal computer for the typical consumer, a personal computer without any USB ports for consumers with strict security requirements, and a personal computer with a high number of bus lanes between the processor and storage and a low number of bus lanes between the processor and USB ports for consumers with high-storage-speed requirements.

However, creating multiple different physical products and manufacturing processes for each unique set of features for a single set of related products is often prohibitively expensive. Conceptually, this is similar to designing and building a first factory for a car manufacturer's yellow cars of a particular model and a completely separate factory for the manufacturer's blue cars of that same particular model. In many electronics-products industries, the costs of designing separate products, as well as designing, building, and operating separate manufacturing systems can sometimes significantly outweigh the costs of adding physical components that are not necessary for a product, but that are used in a related product.

For this reason, manufacturers of electronics products often design product lines such that several individual products in that line are mostly physically identical. For example, these individual products may include the same design of printed circuit board and feature the same components attached to that printed circuit board. However, these manufacturers may customize the feature sets of each model in the product line using software configuration of those models.

For example, two processor models in a line of processors may each feature eight physical processor cores, but the budget processor model may be sold as a four-core processor. In this example, the budget processor model may be loaded with firmware that only allows the processor to recognize four of those eight cores. While the processor manufacturer would be paying for the physical materials for eight cores in all processors, this may be significantly offset by the savings realized by only designing a single physical processor and only designing a single manufacturing process and facility.

However, controlling the feature sets of a particular model in a product line in software, while possible, has disadvantages. Most importantly, software and firmware settings are editable not just by the manufacturer, but by a consumer as well. For this reason, skilled consumers are often able to edit the software and firmware that controls the features of a product. In other words, skilled consumers can sometimes change the set of features of a low-cost, budget product to equal the features of a high-cost, premium product.

For example, a manufacturer of processors may wish to sell a line of processor models with various clock speeds. The manufacturer may do this by producing a high number of practically physically identical processors, but limit the clock speed of some models through firmware configuration. Because the models of processors with high clock speeds are likely to have higher performance than the models with low clock speeds, the manufacturer may be capable of selling the models with high clock speeds at a significantly higher price. The models with low clock speeds, however, may only be of interest to consumers with low performance needs, and may be sold at a far lower price.

However, if the two models of processors are essentially physically identical, a skilled consumer with high performance needs could, in theory, purchase a low-clock-speed model at a low cost. That consumer could then edit the firmware that sets a low clock-speed limit, increasing the clock speed to equal that of the high-performance models. In this way, the consumer would have effectively purchased a high-performance model, while only compensating the manufacturer for a low-performance model.

It is theoretically possible to increase the difficulty of editing the features of a product through software changes. For many products, the benefit gained by a consumer who edits the feature-controlling software may be insignificant when compared to the difficulty of accessing that software and making the necessary changes. However, for particularly valuable products with particularly valuable features, it can be infeasible, or even impossible, to increase the difficulty of editing the software to an extent necessary to deter skilled consumers from doing so. In other words, some products carry enough value that it is likely some consumers will circumvent software-based product segmentation, regardless of the difficulty of the circumvention. Further, due to the value of those products, once a consumer does discover a circumvention method, the process for doing so is likely to be sold or otherwise shared, which may drastically increase the number of consumers who are able to perform the necessary circumvention steps. Once this occurs, the ability of a manufacturer to capitalize upon the high-end features of the product line may be greatly diminished.

To address the issues identified above, embodiments of the present disclosure customize features of practically physically identical models in a product line at the hardware level, rather than the software level. Embodiments of the present disclosure may achieve this by severing electrical ball-grid-array connections that would normally enable those features when the product is undergoing a reflow process.

Ball grid arrays (sometimes referred to herein as "BGAs") are useful for attaching components together in electrical products. In a BGA, a pattern of solder balls (typically a grid) is placed on one of the components (often a PCB, such as a motherboard). Another component, such as a microprocessor, memory chip, or another PCB, is then placed on the solder balls. Because the solder balls contain a sticky resin, a temporary attachment is then formed between the solder balls and both components. During a process called reflow, the solder balls are heated up until the solder therein melts and attaches to the components. The solder balls are then allowed to cool at which point they harden again.

When reflow in a BGA assembly is successful, the hardened solder balls within the BGA assembly not only serve as a structural attachment between the components, but also can function as an electrical connection as well. For example, the solder balls may be placed on electrical contacts (e.g., contact pads, electroplated vias, conductive pins, etc.) on two PCBs of a BGA assembly. After reflow, the solder balls are permanently connected to those electrical contacts, thus allowing communication between the contacts on one PCB and the contacts on the other PCB.

Embodiments of the present disclosure identify connections in a ball grid array that enable, disable, or otherwise affect particular features of an electronic product. To adjust those features, embodiments of the present disclosure apply suction to vias underneath those connections during a reflow stage. At the reflow stage, the solder balls that would normally form an electrical connection between those vias (or a pad on the vias) and another component (e.g., a microprocessor package) are in a melted state. Thus, by applying suction to vias underneath those solder balls, the solder balls can be sucked into the vias during reflow, preventing them from making contact with the "another component." If a target feature of the product is altered by the presence or absence of the electrical connection between hat solder ball and the "another component," sucking the solder ball into the via would therefore alter that target feature in the final product.

For example, as previously discussed, a manufacture of a line of processors may desire to sell two models: an 8-core processor and a 16-core processor. As also has been previously discussed, disabling those cores in software may not prevent a skilled consumer from reactivating them later, allowing that consumer to purchase a 16-core processor while only compensating the manufacturer for an 8-core processor. However, embodiments of the present disclosure could, alternatively, identify the connections through which power is provided to eight of those 16 cores and sever those electrical connections in the ball-grid in the ball grid array that connects the processor to the system. This could be done by applying suction to vias below the solder balls at the ball-grid-array locations of those connections. This would prevent the connections from forming, disabling power to those eight cores at the hardware level.

By adjusting features at the hardware level through the application of suction to ball-grid-array connections during reflow, embodiments of the present disclosure are thus able to create stronger product segmentation and more effectively meet the demands of individual consumers/industries without creating physically different models or manufacturing processes. Further, because the locations of ball-grid-array connections are very rarely accessible after a product is sold, it is very unlikely that a consumer would be able to circumvent the manufacturer's feature customization. In other words, unlike existing efforts of customizing feature sets through software configuration, the customization disclosed through embodiments of the present disclosure are far more permanent and less resistant to tampering.

Figure 1A:
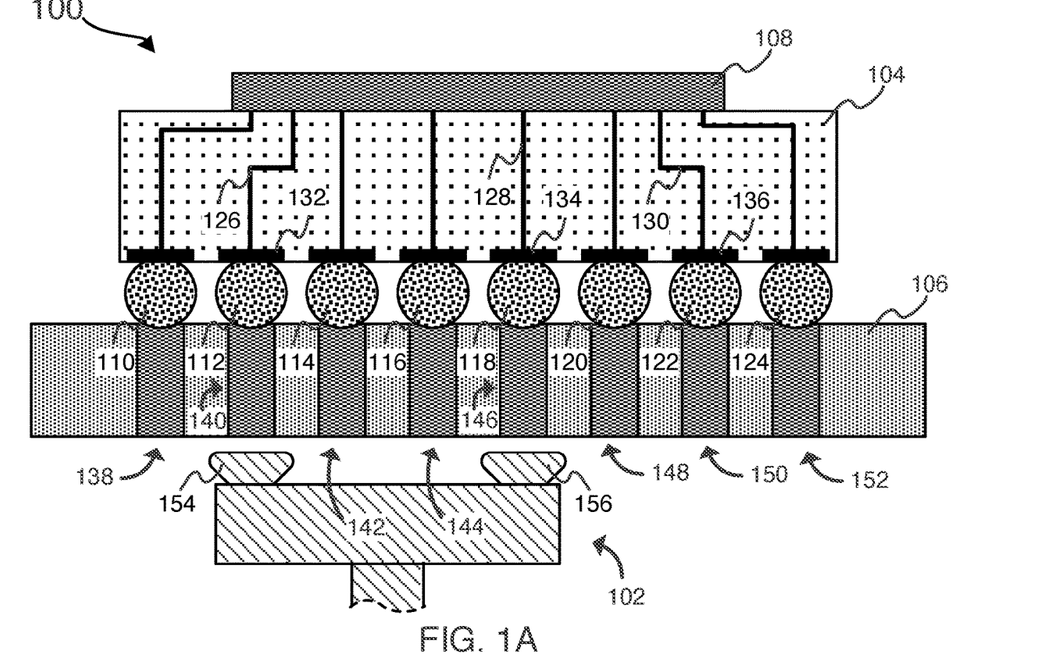
FIG. 1A illustrates an example ball-grid-array package and dedicated vacuum assembly before a reflow process, in accordance with embodiments of the present disclosure.

In the interests of understanding, FIG. 1A illustrates an example ball-grid-array package 100 and dedicated vacuum assembly 102 before a reflow process. Ball-grid-array package 100 (also referred to herein as "BGA package 100") contains two PCBs: PCB 104 and PCB 106. PCB 106 may be, for example, a motherboard of a product and PCB 104 may be a board of a processor package. PCB 104 contains die 108 (e.g., a processor die or memory die), which will be connected to PCB 106 through PCB 104 and solder balls 110 through 124. These connections are shown through a set of electrical traces (e.g., traces 126, 128, and 130) as well as a set of contact pads on the surface of PCB 104 (e.g., contacts 132, 134, and 136).

Solder balls 110 through 124 sit atop electroplated vias 138 through 152. These vias, in this illustration, may also provide the connection between solder balls 110 through 124 and thus for the connection between die 108 and PCB 106. In FIG. 1A, traces 126 and 128 may be responsible for enabling a feature to die 108. For example, die 108 may be a processor chip, and traces 126 and 128 may provide power to two of the processor's cores. In other words, power from the overall system may transfer from PCB 106, through vias 140 and 146, through solder balls 112 and 118, through contact pads 132 and 134, and through traces 126 and 128 to die 108. For this reason, if one or more of those connections were not made, those two cores would not be functional in the finished product.

Vacuum assembly 102 contains two vacuum heads 154 and 156. As illustrated, vacuum heads 154 and 156 sit below vias 140 and 146. In other words, vacuum assembly 102 may be dedicated to applying suction to only vias 140 and 146 to disable the electrical connections at the corresponding BGA locations (i.e., the locations of solder balls 112 and 146). As used herein, a "BGA location" may refer to the location of a connection between two components through a solder ball in a ball grid array, the location in a ball grid array at which a solder ball was removed during reflow (preventing a connection at that BGA location), or the location in a component of a future ball grid array (e.g., a plated via in an array of plated vias) that has not yet undergone reflow, but that is designed to form a ball grid array during reflow.

Disabling the electrical connections at the BGA locations for solder balls 112 and 146 may be useful, for example, when a manufacturer has decided to target a feature that is enabled by those BGA locations for modification (e.g., disablement). By designing a dedicated vacuum assembly that specializes in applying suctions only to the vias that correspond to a target feature, the cost of designing, manufacturing, and operating vacuum assembly 102 may be reduced.

Figure 1B:
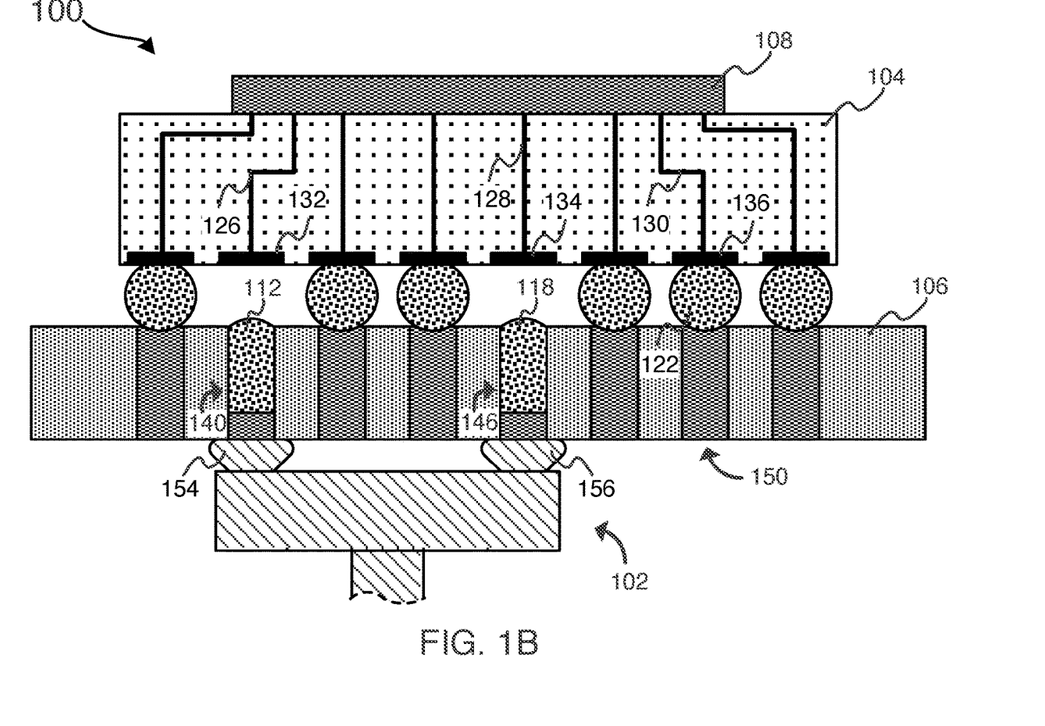
FIG. 1B illustrates the example ball-grid-array package and dedicated vacuum assembly during a reflow process, in accordance with embodiments of the present disclosure.

FIG. 1B illustrates example ball-grid-array package 100 and dedicated vacuum assembly 102 during a reflow process. In FIG. 1B, vacuum assembly 102 has been raised towards ball-grid-array package 100, such that vacuum heads 154 and 156 contact vias 140 and 146. During reflow, vacuum heads 154 and 156 apply suction to vias 140 and 146, causing solder balls 112 and 118 to enter the vias. As is illustrated, this prevents solder balls 112 and 118 from making contact with contact pads 132 and 134, which therefore prevents a connection between PCB 106 and die 108 through traces 126 and 128.

Continuing the previous example, if die 108 were a processor die and traces 126 and 128 powered two cores of the processor die, applying suction to vias 140 and 146 as shown would disable those two cores. However, no suction was applied to via 150, and thus solder ball 122 was allowed to create an electrical connection between PCB 106 and contact pad 136. If contact pad 136 provided power to a third core of the processor die through trace 130, that third processor die would still receive power from PCB 106 and would still be functional.

Thus, once reflow is completed, the connections and lack of connections between PCB 106 and PCB 104 through solder balls 110 through 124 would become mostly permanent. Thus, the feature set configuration that was performed by sucking solder balls 112 and 118 into vias 140 and 146 would also become mostly permanent, preventing that configuration from being reversed through software changes by a skilled consumer.

Figure 2:
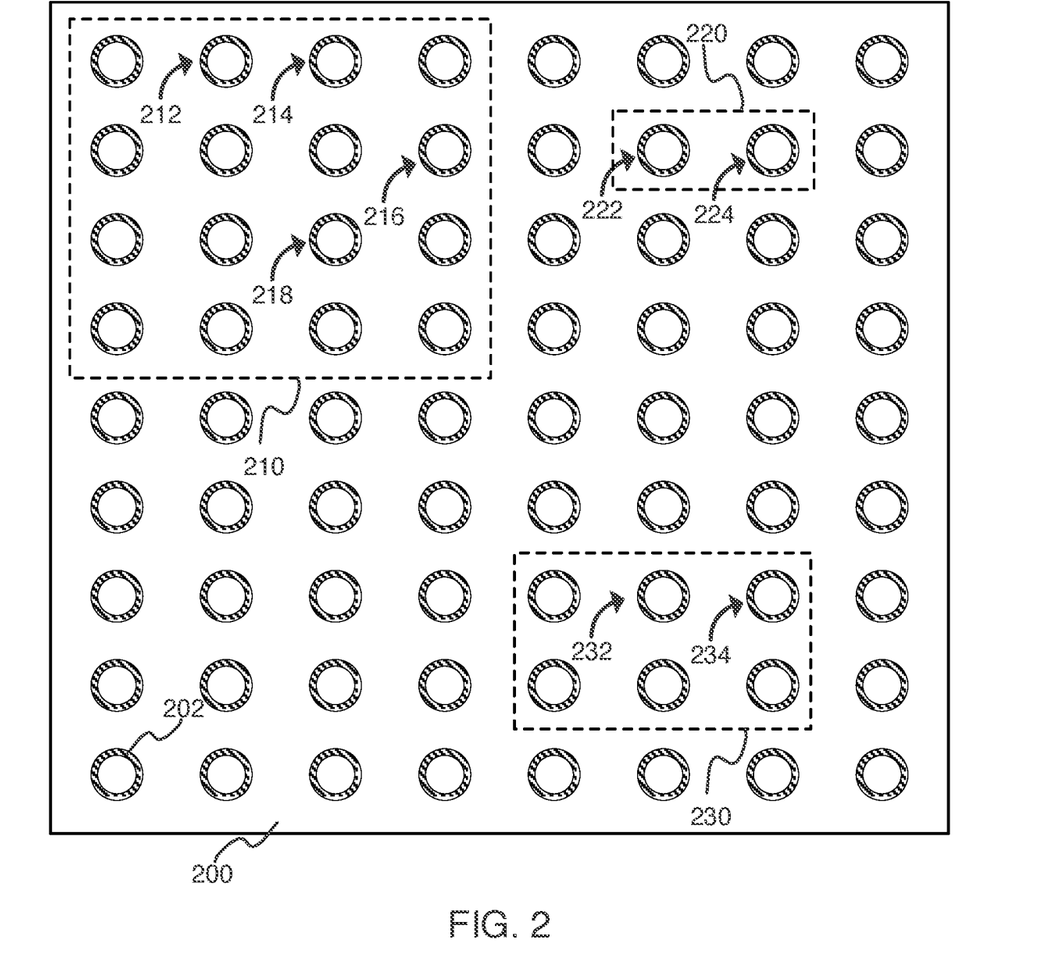
FIG. 2 illustrates a bottom-up view of an example set of ball-grid-array locations that could be treated with a vacuum assembly during reflow in order to alter the feature set of a resulting product in accordance with embodiments of the present disclosure.

FIG. 2 illustrates a bottom-up view of an example set of ball-grid-array locations that could be treated with a vacuum assembly during reflow in order to alter the feature set of a resulting product in accordance with embodiments of the present disclosure. It is of note that FIG. 2 is meant as an aid to understanding only, and thus the features of FIG. 2 are not meant to be interpreted as literal representations of any embodiment of the present disclosure. For example, FIG. 2 features PCB 200, which in turn features an array of plated vias such as plated via 202. However, PCB 200 could in reality take the form of a system motherboard, in which case only a small portion of the motherboard may be covered by any single array of plated vias. Portions of PCB 200 that are not covered by the illustrated array of plated vias have been omitted from FIG. 2 for the ease of presentation.

FIG. 2 illustrates the "bottom" of PCB 200, and thus the view of PCB 200 could be the bottom of a system motherboard or processor package. Each plated via in PCB 200 represents a potential BGA connection at that corresponding BGA location. These plated vias may be organized into sets of vias based on the purpose of the connection formed at that BGA location. For example, the plated vias within set of vias 210 may all correspond to the functionality of a processor core in a processor that could be attached to PCB 200. Set of vias 220 may correspond to a set of configuration vias that could be used to affect a variety of system features (e.g., the clock speed of a processor, whether the processor is overclockable, etc.). Set of vias 230 may establish the memory capabilities of the system.

Applying suction to the vias in PCB 200 during reflow may affect the features of the system into which PCB 200 is installed. Specifically, by applying sufficient suction to a particular via at a particular BGA location to prevent a solder ball located at that BGA location from forming an electrical connection, the feature set of the system could be populated, depopulated, or changed. Thus, by identifying the BGA location of a BGA connection that corresponds to a particular feature, systems and methods of the present disclosure can identify a BGA location to apply suction to in order to affect that feature. Once a system identifies a BGA location to apply suction to, that BGA location may be referred to herein as a "target BGA location."

For example, set of vias 210 contains target BGA locations 212, 214, 216, and 218. Electrical connections between PCB 200 and a processor package at these BGA locations may deliver power to a processor core in that processor package. Thus, by applying sufficient suction at BGA locations 212-218 to prevent an electrical connection at that BGA location (for example, by drawing the entire solder ball into the via), power to that processor core could be prevented, and that core could be disabled. Thus, BGA locations 212-218 could be referred to as target BGA locations for disabling that processor core. Suction could be applied to the vias at these BGA locations to change the number of cores that could be used in a processor, allowing a manufacturer to sell a processor with fewer cores to a budget segment of the market without creating a second physical processor or risking circumnavigation of disabling the core in software.

Set of vias 220 contains target BGA locations 222 and 224. Electrical connections between PCB 200 and a processor package at these BGA locations may establish a voltage-based configuration that could be read by the system and affect the system configuration. For example, a processor could detect the presence or absence of a current at each of the vias at BGA locations 222 and 224 and determine if a voltage of a current at those locations is above a voltage threshold. If the processor detects a voltage above that threshold, the processor could establish a high bit (e.g., "1," "on," "true") for that BGA location. If the processor does not detect a voltage above that threshold, however, the processor could establish a low bit (e.g., "0," "off," "false") for that BGA location. Because each of the vias at BGA locations 222 and 224 could have an independent voltage, this example would provide a potential of 4 different voltage-based configurations (i.e., 00, 01, 10, 11).

For example, if suction were applied to both BGA locations 222 and 224 during reflow, no current would flow through either BGA location, causing the processor to read a voltage of 0V for each via. If the threshold voltage were set at 2V, then the processor would not detect a current at either via with a voltage above the threshold voltage. This would result in a voltage-based configuration of "00." This voltage-based configuration could cause a phase lock loop in the processor to apply a "slow" clock signal, such as 3.5 GHz. This could be performed by setting the multiplier to a frequency oscillator circuit to a slightly lower number.

However, if suction were only applied to BGA location 222 during reflow, current would flow through the BGA connection corresponding to BGA location 224, which could cause the processor to detect a voltage signal of 5V at that via. If no voltage were detected at BGA location 22, this example would result in a voltage-based configuration of 01. This higher voltage signal could cause a phase lock loop to apply a faster clock signal, such as 4.25 GHz. Further, if no suction were applied to BGA locations 222 or 224 during reflow, the processor could measure a voltage of 5V at each of BGA locations 222 and 224, resulting in a voltage-based configuration of 11. This could cause the phase lock loop to apply an "fastest" clock signal, such as 4.5 GHz. Thus, by applying suction to the vias at BGA locations 222 and 224, a manufacturer could segment its product line by processor speed at the hardware level, rather than the software level.

Set of vias 230 contain target BGA locations 232 and 234. As noted, set of vias 230 affect the memory capabilities of the system. For example, set of vias 230 may affect the addressing capabilities of a processor or the configuration of a memory controller in the system. For example, the vias at BGA locations 232 and 234 may provide signal to the address bits of a memory bus of the system processor. When fully functional, for example, the processor may be capable of addressing 64 GB of memory. However, by applying suction to the via at BGA location 234 during reflow. One of the address bits of the memory bus may be deactivated. This would limit the processor's capability to address memory by a factor of 50%. In other words, the processor would only be capable of addressing 32 GB of memory, rather than 64 GB. Further, by applying suction to both of the vias at BGA locations 232 and 234 during reflow, two address bits of the memory bus could be deactivated. This would limit the processor's capability to address memory by another factor of 50%. In other words, the processor would only be capable of addressing 16 GB of memory, rather than 32 GB or 64 GB. Thus, by applying suction to the vias at BGA locations 232 and 234, a manufacturer could not only segment its product line by the amount of memory in a system, but also prevent a consumer from defeating that segmentation by upgrading the system memory after purchase.

As noted earlier, FIGS. 1A and 1B illustrate a dedicated vacuum assembly 102 that can be applied to a pre-determined set of target vias in a ball-grid-array assembly during reflow. This may be beneficial, for example, when the vacuum assembly is only applied to a single product. For example, vacuum assembly 102 could be used in the manufacturing process that attaches PCB 200 (of FIG. 2) to another BGA component. If vacuum assembly had 4 vacuum heads rather than 2 vacuum heads 154 and 156, the vacuum assembly could be used to disable electrical connections at BGA locations 212-216. When a processor core powered by those BGA locations was to be enabled, the vacuum assembly would not create suction on the associated vias. However, when the processor core was to be disabled, the vacuum assembly could contact PCB 200 and apply suction to those associated vias.

However, while populating or disabling a processor core for a single processor could be a binary change (i.e., apply suction with a vacuum assembly or do not), some use cases may involve more permutations. For example, set of vias 220 and set of vias 230 each involve the application of suction to 0, 1, or 2 vias, resulting in 9 possible permutations between the two sets of vias, and 18 for the entire PCB 200 as illustrated. Further, these are simplifications of potential real-world examples for the sake of understanding; real-world examples may involve more than 3 different permutations for a single feature. Thus, the number of permutations for an entire BGA assembly could be significantly larger. This may at least require vacuum assemblies, such as assembly 102, that could be applied independently. However, in some BGA assemblies, further flexibility may be desired.

Further, it may be desirable to apply some vacuum assemblies to multiple different manufacturing processes. For example, a vacuum assembly could be used in the manufacturing process for a first processor. However, that processor may have a realistic lifespan of four years before which it is discontinued and replaced with new processors. Being able to transfer the vacuum assembly that was used to configure the feature sets of the first processor to the manufacturing of the second processor may reduce the cost of designing and building a manufacturing process for the newer processor.

For these reasons, an adjustable vacuum assembly with sufficient flexibility to adjust to a high number of sets of features for a single BGA assembly, as well as to be applied on multiple BGA assemblies, may be beneficial.

Figure 3A:
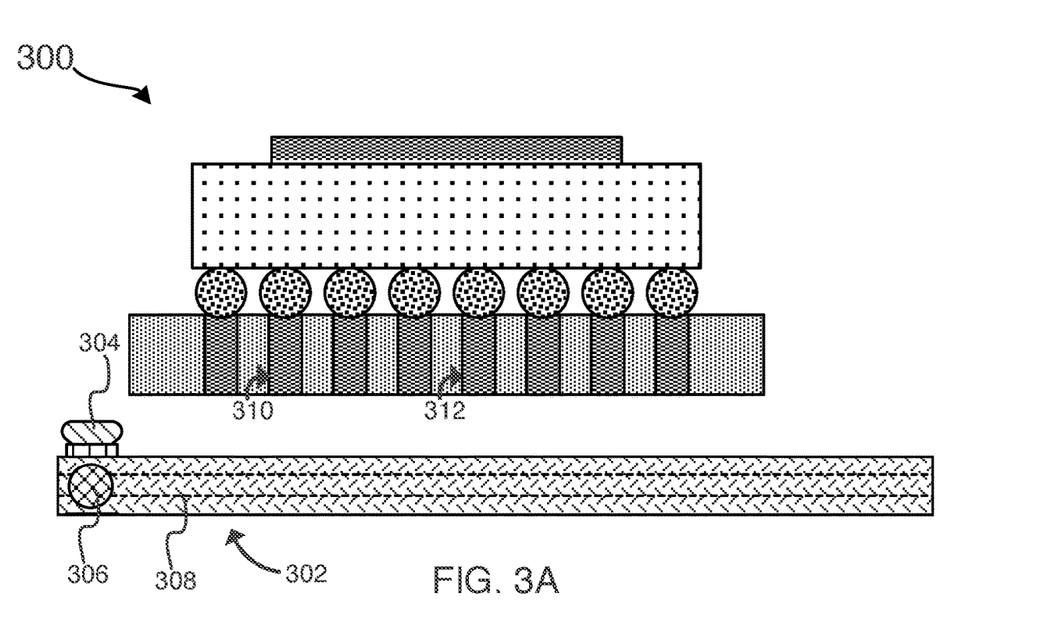
FIG. 3A illustrates an example ball-grid-array package and adjustable vacuum assembly before a reflow process, in accordance with embodiments of the present disclosure.

FIG. 3A illustrates an example ball-grid-array package 300 and adjustable vacuum assembly 302 before a reflow process. Vacuum assembly 302 comprises a single vacuum head 304. Vacuum head 302 may be connected to a movement system 306 (e.g., a set of gears) that is capable of moving on track 308. This may enable vacuum head 304 to translate left and right below BGA assembly 300. Further, vacuum assembly may also be capable of translating along the depth of BGA assembly 300 (e.g., into an out of the paper). Through this movement system, vacuum head 302 may be capable of navigating to any BGA location in BGA assembly 300.

For example, as illustrated in FIGS. 1A-1B, a manufacture may wish to disable the connections at two BGA locations in BGA assembly 300. Specifically, a manufacture may wish to disable the BGA locations associated with vias 310 and 312. Rather than design a dedicated vacuum assembly to apply suction to vias 310 and 312 (and only vias 310 and 312) simultaneously, vacuum head 304 could apply suction to vias 310 and 312 in turn.

Figure 3B:
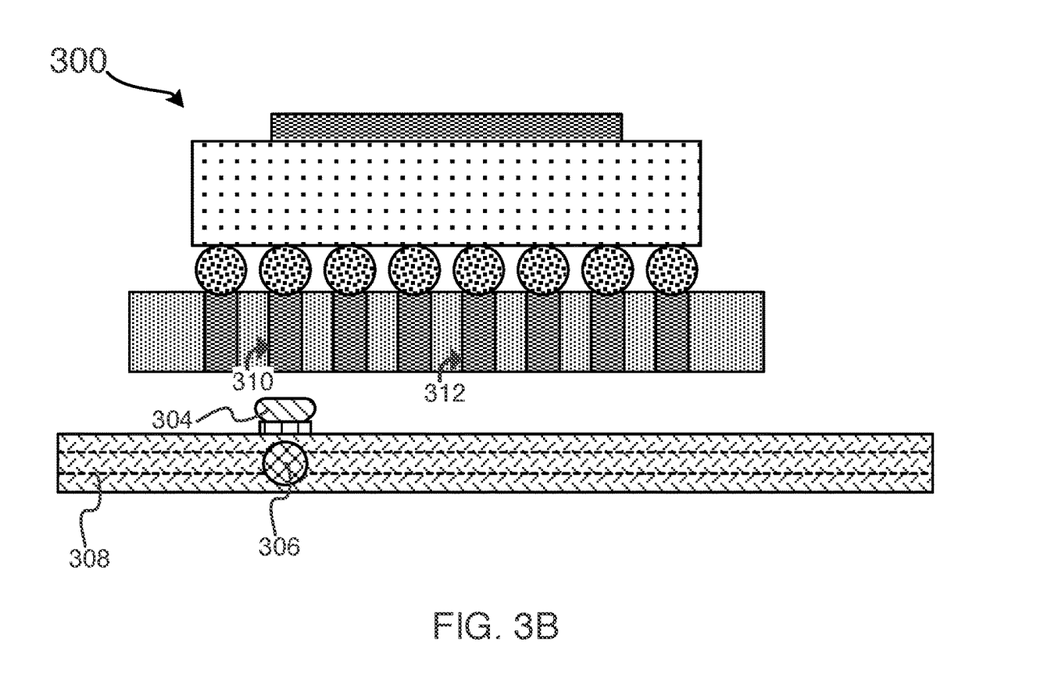
FIG. 3B illustrates the example ball-grid-array package during the reflow process after the adjustable vacuum assembly has navigated to a target ball-grid-array location, in accordance with embodiments of the present disclosure.
Figure 3C:
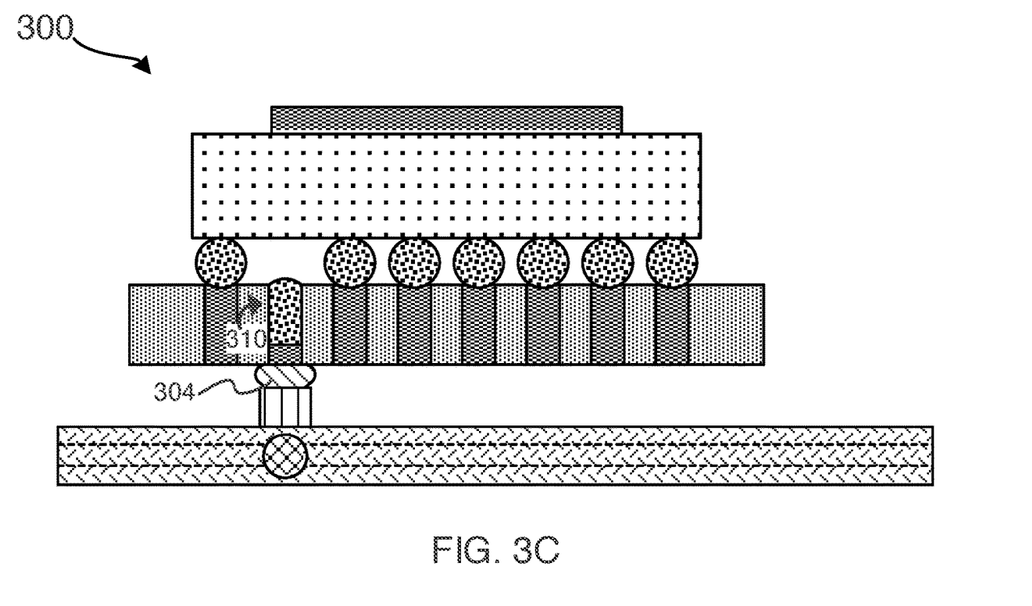
FIG. 3C illustrates the example ball-grid-array package during the reflow process while the adjustable vacuum assembly is applying suction to the target ball-grid-array location, in accordance with embodiments of the present disclosure.

FIG. 3B illustrates the first set of this procedure. As shown in FIG. 3B, vacuum head 304 has translated along track 308, using movement system 306, until it is directly under via 310. Next, FIG. 3C illustrates that vacuum head 304 has advanced to contact the PCB and applied suction to the via. This has caused the solder ball at the corresponding BGA location to be drawn into the via, preventing an electrical connection at that BGA location.

Figure 3D:
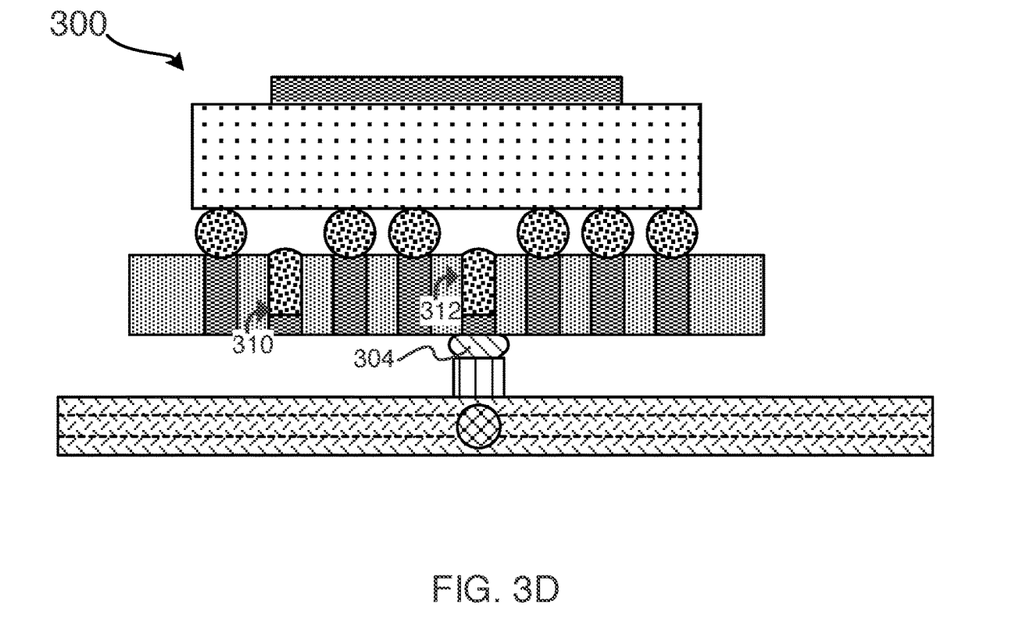
FIG. 3D illustrates the example ball-grid-array package during the reflow process while the adjustable vacuum assembly is applying suction to a second target ball-grid-array location, in accordance with embodiments of the present disclosure.

Proceeding to FIG. 3D, after applying suction to via 310, vacuum head could translate along track 308 again until it is under via 312, contact the PCB, and applied suction to the via. This would also draw the solder ball at the BGA location corresponding to via 312 into the via.

Of note, vacuum head 304 applies suction to via 310 and 312 at different times in the embodiment illustrated in FIGS. 3A through 3D. However, in many implementations, this may be completely feasible. Reflow may occur over a long enough time (i.e., solder balls 310 and 312 may be fluid for a long enough time) for vacuum head 304 to apply suction to each via individually. Further, it may be possible to draw the solder into each via far enough that it does not exit the via after suction is no longer applied, however, it may also be possible for vacuum head 304 to completely draw the solder into and out of the via, preventing a risk of the solder exiting the via and creating a short.

In some implementations, however, a single vacuum head may be unable to apply suction to a sufficient number of vias during reflow. For example, if a particular set of features required vacuum head 304 to apply suction to 200 vias during reflow, BGA assembly 300 may begin to cool before vacuum head 304 has drawn all 200 solder balls into those vias. If BGA assembly 300 cools too much, vacuum head 304 may be unable to draw in all 200 solder balls to create the desired set of features.

In these implementations, it may be desirable to utilize a vacuum assembly with multiple adjustable heads, rather than 1. For example, a reflow system could utilize four vacuum assemblies that are similar to vacuum assembly 302. In this example, each vacuum assembly could be capable of navigating to one quadrant of the PCB. Using FIG. 2 as an example, a first vacuum assembly may be capable of navigating to any via in the top-left quadrant, and would therefore apply suction to the vias at BGA locations 212-218 during reflow. A second vacuum assembly may be capable of navigating to any via in the top-right quadrant, and would therefore apply suction to one or both of the vias at BGA locations 222 and 224. A third vacuum assembly may be capable of navigating to any via in the bottom-right quadrant, and would therefore apply suction to one or both of the vias at BGA locations 232 and 234. Finally, a fourth vacuum assembly may be capable of navigating to any via in the bottom-left quadrant. Because no BGA locations in the bottom-left quadrant were associated with target features in the example described in connection with FIG. 2, this vacuum assembly would not need to apply suction to any via during reflow. In some embodiments, therefore, this vacuum assembly could be deactivated or not installed.

In some implementations, however, even a reasonable amount of moveable vacuum heads may be insufficient to apply suction to all target BGA locations before reflow is completed. For example, some quadrants may contain multiple processor cores to disable rather than the single processor core disabled in set of vias 210. Further, in reality, disabling a single processor core in reality may require applying suction to 10 or more vias, rather than 4. Thus, if a single quadrant contained four cores to be disabled, that would require applying suction to 40 vias solely for disabling those cores. Further, if the configuration of additional features requires suction to be applied in that same quadrant, the number of vias would be even larger. Applying suction to that many vias with a single vacuum head during a normal reflow process may be difficult.

In some embodiments, it may be possible to increase the number of moveable vacuum heads in order to address the above issues. For example, rather than dividing a ball grid array into quadrants, some embodiments may divide it into nine or sixteen sections. However, designing, installing, and maintaining the moving parts for that many moveable vacuum heads may, in some implementations, be quite difficult. For this reason, some embodiments of the present disclosure may utilize an array of vacuum heads that are each able to navigate to a single via in a ball grid array rather than a set of vacuum heads that are moveable to any via in a ball-grid array, or to any via in a section of a ball-grid array. While this may require significantly more vacuum heads, the simplicity of the moving parts required to apply suction to any single via (as opposed to a system with multiple vacuum heads that could each navigate to multiple vias) may counter balance the need for more vacuum heads.

Figure 4A:
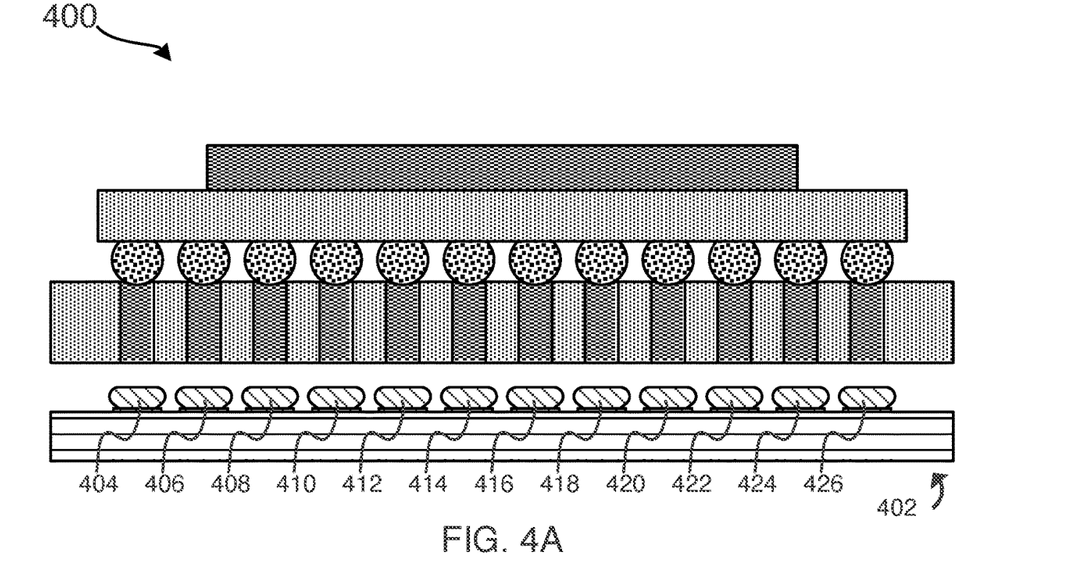
FIG. 4A illustrates an example ball-grid-array package and an adjusting vacuum array before a reflow process, in accordance with embodiments of the present disclosure.

FIG. 4A illustrates an example ball-grid-array package 400 and an adjusting vacuum array 402 before a reflow process. Adjustable vacuum array 402 contains, as illustrated, twelve vacuum heads 404-426, each of which corresponds to one of the twelve vias in ball-grid-array package 400. Further, though not illustrated, adjustable vacuum array 402 may also contain a similar row of vacuum heads for every vias that is not pictured in FIG. 4A. For this reason, there may be no need for any of vacuum heads 404-426 to navigate to other vias (either left or right or into and out of the paper); every via in ball-grid-array package 400 may be paired with a dedicated vacuum head.

Figure 4B:
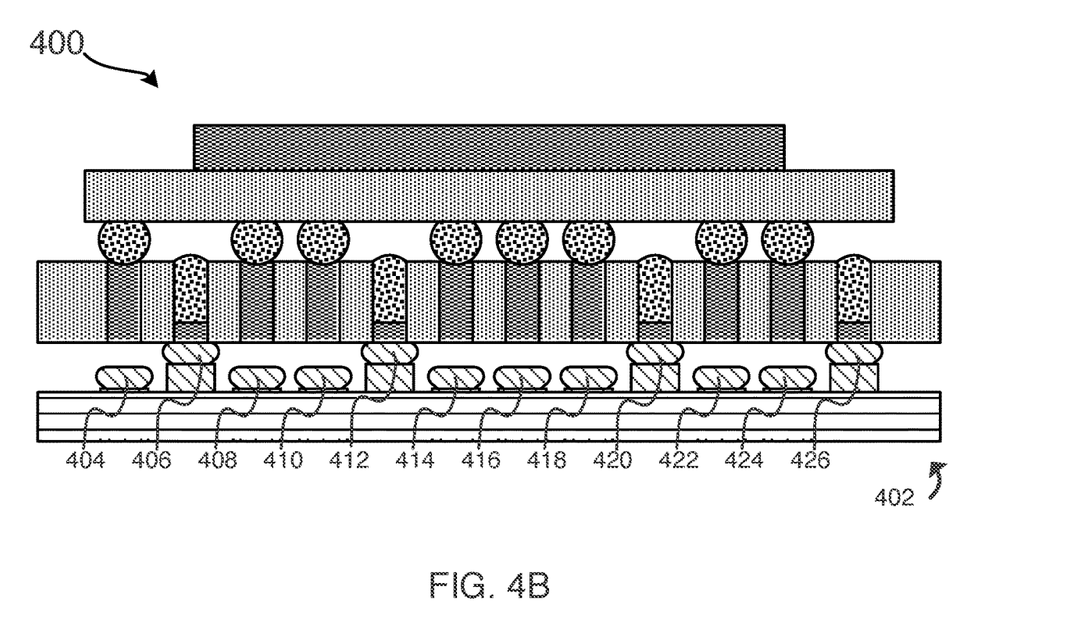
FIG. 4B illustrates the example ball-grid-array package during the reflow process while the adjustable vacuum array is applying suction to four target ball-grid-array locations, in accordance with embodiments of the present disclosure.

FIG. 4B illustrates example ball-grid-array 400 package during a reflow process while adjustable vacuum array 402 is applying suction to four target ball-grid-array locations. Specifically, vacuum heads 406, 412, 420, and 426 are applying suction at four target ball-grid-array locations simultaneously. As such, adjustable vacuum array 402 may be capable of applying suction at a larger number of vias during reflow than vacuum assemblies 302 or 102 in some use cases. This is because, as illustrated in FIG. 4B, without a need to navigate between vias and apply suction to those vias one at a time, there is no risk that the amount of time required to apply suction to all target vias will be greater than the duration of reflow. As such, there is no risk that the solder at any target ball-grid-array location would have cooled and hardened to such an extent that the vacuum head would be unable to draw it into the corresponding via.

Some embodiments of the present disclosure may use any vacuum assembly described herein. For example, some ball-grid-array assemblies may require a simple vacuum assembly, such as vacuum assembly 102, in a first quadrant, a moveable vacuum assembly, such as vacuum assembly 302, in a second quadrant, and a vacuum array, such as vacuum assembly 402, in the remaining half of the ball-grid-array assembly.

Figure 5:
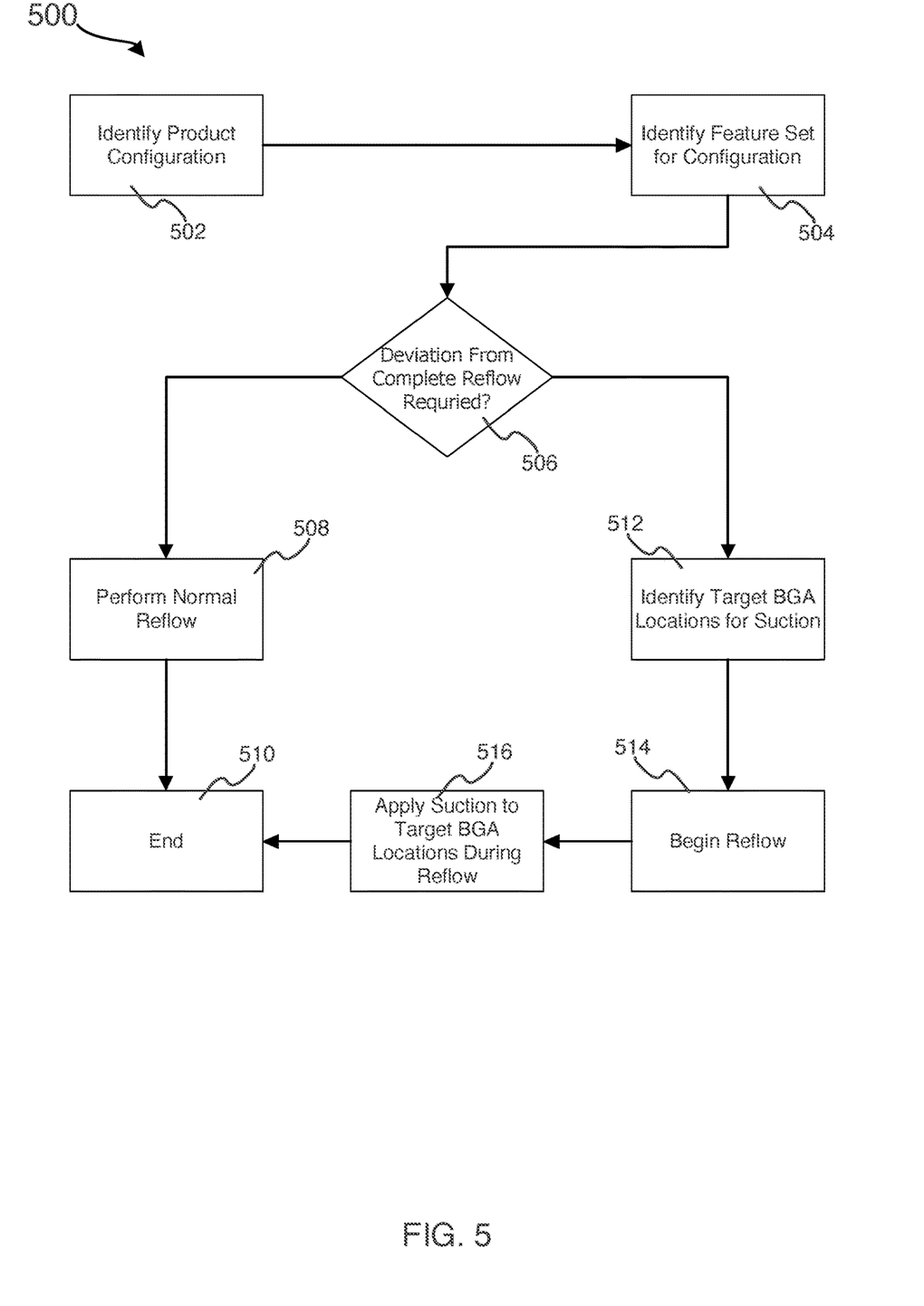
FIG. 5 illustrates an example method of applying suction to identified ball-grid-array locations during reflow in order to alter the feature set of a resulting product in accordance with embodiments of the present disclosure.
Figure 6:
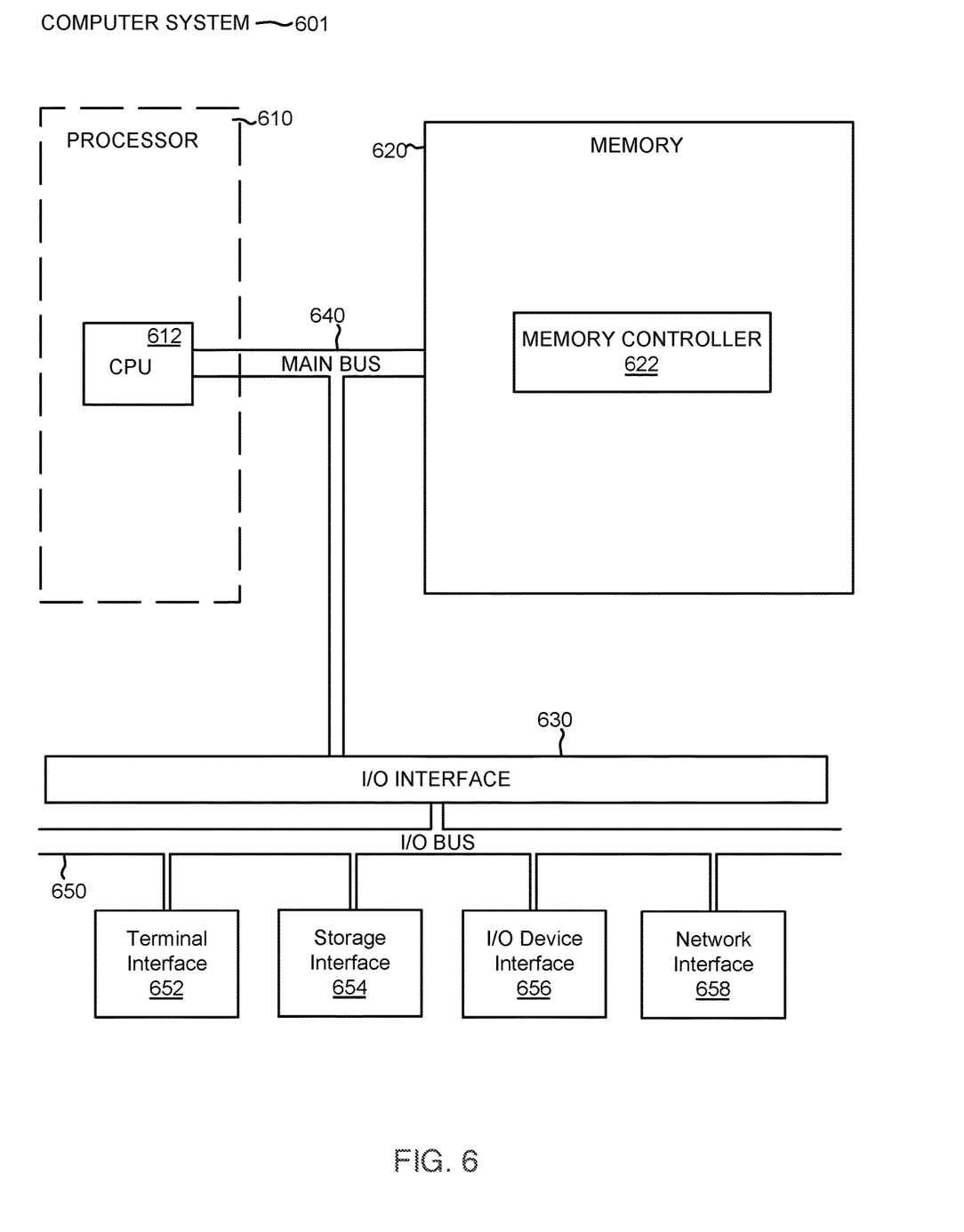
FIG. 6 illustrates the representative major components of an example computer system that may be used in accordance with embodiments of the present disclosure.

While various configurations of vacuum assemblies are possible, any combination of vacuum assembly or assemblies may include a method of identifying target BGA locations based on a target feature set for a product configuration. FIG. 5 illustrates an example method 500 of applying suction to identified target ball-grid-array locations during reflow in order to alter the feature set of a resulting product. This method may be performed, for example, by a computer system that is controlling a reflow process for a BGA assembly, such as computer system 600.

Method 500 begins in block 502, at which a product configuration is identified. Identifying a product configuration may include, for example, identifying a model or other code of a product. For example, the product may be one of a line of products that are all nearly physically identical, but that differ in the features that are enabled, disabled, or altered. For example, the product may be a processor in a line of processors that all use the same die and PCB design, but that are segmented into different models based on core count, frequency, memory capabilities, I/O capabilities, or others.

Block 504 includes identifying a feature set for the configuration identified at block 502. Continuing the example of a line of processors, block 504 may cross reference a model number identified at block 502 with table that contains a list of features for each model number in the line of processors. Thus, at block 504, a system could identify that a processor contains 8 out of 12 possible cores enabled, and should be configured to operate at 4.5 GHz rather than 5.0 GHz. This may be, for example, because the processor is not the most powerful processor in the line of processors, and thus contains features that are less desirable that the most powerful, most expensive processor in the line.

Block 506 includes determining whether attaining the feature set identified at 504 requires a deviation from complete reflow. A deviation from complete reflow, as used herein, may include applying suction to any BGA location in a BGA assembly in order to prevent an electrical connection at that BGA location. This may include, for example, applying suction to disable a set of cores, applying suction to disable a connection to an I/O bus, applying suction to select a configuration in a set of solder balls (similar to set of vias 220 of FIG. 2), etc.

For example, if the product configuration identified at block 502 were a specialized processor for a very security-focused client, the corresponding feature set identified at block 504 may require that the processor be unable to communicate over one or more USB busses. In this example, block 506 may determine that an alteration to the standard reflow process for the line of processors is necessary.

If a system determines, at block 506, that no deviation from complete reflow is necessary (i.e., if the feature set identified at block 504 requires a BGA connection at all BGA locations), the system performs normal reflow at block 508. Normal reflow may include, for example, reflow in which no vias have suction applied to them using a vacuum assembly. After normal reflow, method 500 may end in block 510.

However, if the system determines, at block 506, that the identified feature set requires a deviation from complete reflow, the system proceeds to block 512 in which the system identifies the BGA locations at which a BGA connection should be prevented in order to attain the feature set identified at block 504. These identified BGA locations may be referred to herein as "target BGA locations."

For example, the product configuration identified at block 502 may be a network add-in card that can be added to a computer system in order to make that computer system capable of communicating over an Ethernet or wireless network. The configuration identified may be the model number of a budget add-in card in a line of add in cards, and thus the feature set identified at block 504 may identify that the card should be capable of communicating at a maximum of 1 gigabits per second, rather than 5 gigabits per second or 10 gigabits per second. In this example, block 512 may identify the BGA locations corresponding to the lanes in a network communication bus that enables the network card to send/receive 10 gigabits of data per second rather than 1 gigabits of data per second. Those BGA locations may be identified as "target BGA locations" for suction during reflow.

After the system identifies the target BGA locations at block 512, the system begins reflow in block 514. During reflow, the system then applies suction to the target BGA locations in block 516. As described throughout the specification, this may include advancing a vacuum head to a via corresponding to that BGA location and applying suction to the via, drawing a solder ball at the BGA location into the via. That may prevent an electrical connection from forming at that BGA location.

Continuing the network add-in-card example, the BGA assembly may include a set of BGA locations that correspond to the communication lanes for the network card. The target BGA locations identified at block 512 may be a subset of those communication lanes. Preventing the connections at the target BGA locations may disable that subset of communication lanes, causing the network communication card to be capable of communicating at 1 gigabits per second, rather than 10 gigabits per second.

Once suction is applied to the target BGA locations in block 516, the solder balls at those target BGA locations should either be within a corresponding via or sucked through the via completely. Thus, the system may proceed to block 510, at which reflow, and method 500, ends.

Of note, the depiction of FIG. 5 represents an example series of operations by which method 500 could proceed. However, that example series is not intended to be limiting. For example, depending on the nature of the system performing method 500, or a similar method, some operations may be in a different order than presented, more operations may be included, or some operations may be omitted. In some embodiments, for example, identifying a product configuration in block 502 could enable a computer to identify target BGA locations for suction in block 512. This may occur if a computer were able to cross reference the identified product configuration with a table of product configurations paired with target BGA locations. That cross referencing may, therefore, enable a computer to skip from block 502 to block 512.

Further, in some embodiments, a computer may never receive a product configuration, but may instead receive a feature set for the product instead. This feature set could then be cross referenced with a similar table of feature sets and target BGA locations.

In both of these examples and in FIG. 5 as illustrated, the identification of target BGA locations could be said to be based on an identified product configuration, an identified feature set, or both.

FIG. 6 depicts the representative major components of an example Computer System 601 that may be used in accordance with embodiments of the present disclosure. The particular components depicted are presented for the purpose of example only and are not necessarily the only such variations. The Computer System 601 may include a Processor 610, Memory 620, an Input/Output Interface (also referred to herein as I/O or I/O Interface) 630, and a Main Bus 640. The Main Bus 640 may provide communication pathways for the other components of the Computer System 601. In some embodiments, the Main Bus 640 may connect to other components such as a specialized digital signal processor (not depicted).

The Processor 610 of the Computer System 601 may include one or more CPUs 612. The Processor 610 may additionally include one or more memory buffers or caches (not depicted) that provide temporary storage of instructions and data for the CPU 612. The CPU 612 may perform instructions on input provided from the caches or from the Memory 620 and output the result to caches or the Memory 620. The CPU 612 may include one or more circuits configured to perform one or methods consistent with embodiments of the present disclosure. In some embodiments, the Computer System 601 may contain multiple Processors 610 typical of a relatively large system. In other embodiments, however, the Computer System 601 may contain a single processor with a singular CPU 612.

The Memory 620 of the Computer System 601 may include a Memory Controller 622 and one or more memory modules for temporarily or permanently storing data (not depicted). In some embodiments, the Memory 620 may include a random-access semiconductor memory, storage device, or storage medium (either volatile or non-volatile) for storing data and programs. The Memory Controller 622 may communicate with the Processor 610, facilitating storage and retrieval of information in the memory modules. The Memory Controller 622 may communicate with the I/O Interface 630, facilitating storage and retrieval of input or output in the memory modules. In some embodiments, the memory modules may be dual in-line memory modules.

The I/O Interface 630 may include an I/O Bus 650, a Terminal Interface 652, a Storage Interface 654, an I/O Device Interface 656, and a Network Interface 658. The I/O Interface 630 may connect the Main Bus 640 to the I/O Bus 650. The I/O Interface 630 may direct instructions and data from the Processor 610 and Memory 620 to the various interfaces of the I/O Bus 650. The I/O Interface 630 may also direct instructions and data from the various interfaces of the I/O Bus 650 to the Processor 610 and Memory 620. The various interfaces may include the Terminal Interface 652, the Storage Interface 654, the I/O Device Interface 656, and the Network Interface 658. In some embodiments, the various interfaces may include a subset of the aforementioned interfaces (e.g., an embedded computer system in an industrial application may not include the Terminal Interface 652 and the Storage Interface 654).

Logic modules throughout the Computer System 601— including but not limited to the Memory 620, the Processor 610, and the I/O Interface 630—may communicate failures and changes to one or more components to a hypervisor or operating system (not depicted). The hypervisor or the operating system may allocate the various resources available in the Computer System 601 and track the location of data in Memory 620 and of processes assigned to various CPUs 612. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   identifying a set of features for a product;
   determining that preventing an electrical connection at a target ball-grid-array location on a ball-grid-array assembly of the product would result in the set of features, wherein the target ball-grid-array location comprises a set of vias that does not include all vias in the ball-grid-array assembly;
   applying, during reflow of the ball-grid-array assembly, suction to the set of vias at the target BGA location; and
   drawing, with the application of suction, a set of solder balls at the target BGA location into the set of vias.

2. The method of claim 1, wherein the application of suction utilizes a dedicated vacuum assembly.

3. The method of claim 1, wherein the application of suction utilizes an adjustable vacuum assembly.

4. The method of claim 3, wherein the adjustable vacuum assembly includes a vacuum head that is moveable to multiple vias in the ball-grid-array assembly.

5. The method of claim 3, wherein the adjustable vacuum assembly includes an array of vacuum heads.

6. The method of claim 1, wherein the determining comprises cross referencing the set of features with a table that pairs sets of features with target BGA locations.

7. The method of claim 1, wherein the product is a processor, and the set of features comprises a number of cores enabled in the processor.

8. The method of claim 7, wherein the electrical connection at the target ball-grid-array location would, if not prevented, provide power to a processor core.

9. The method of claim 1, wherein the electrical connection at the target ball-grid-array location would, if not prevented, provide a voltage signal that corresponds to a voltage-based configuration.

10. The method of claim 1, wherein applying suction to the set of vias at the target BGA location disables an 1/0 capability of the product.

11. A system comprising:
    a processor; and
    a memory in communication with the processor, the memory containing program instructions that, when executed by the processor, are configured to cause the processor to perform a method, the method comprising:
    identifying product configuration for a product, wherein the product configuration corresponds to a set of features for the product;
    determining that preventing an electrical connection at a target ball-grid-array location on a ball-grid-array assembly of the product would result in the product configuration, wherein the target ball-grid-array location comprises a set of vias that does not include all vias in the ball-grid-array assembly;
    applying, during reflow of the ball-grid-array assembly, suction to the set of vias at the target BGA location; and
    drawing, with the application of suction, a set of solder balls at the target BGA location into the set of vias.

12. The system of claim 11, wherein the application of suction utilizes a dedicated vacuum assembly.

13. The system of claim 11, wherein the application of suction utilizes an adjustable vacuum assembly.

14. The system of claim 11, wherein the determining comprises cross referencing the product configuration with a table that pairs product configurations with target BGA locations.

15. The system of claim 11, wherein the product is a processor, and wherein the set of features comprises a clock speed of the processor.

16. The system of claim 11, wherein the product is a processor, and wherein the set of features comprises a memory addressability of the processor.

* * * * *